US008964796B2

(12) United States Patent
Wunderer et al.

(10) Patent No.: US 8,964,796 B2
(45) Date of Patent: Feb. 24, 2015

(54) STRUCTURE FOR ELECTRON-BEAM PUMPED EDGE-EMITTING DEVICE AND METHODS FOR PRODUCING SAME

(71) Applicant: Palo Alto Research Center Incorporated, Palo Alto, CA (US)

(72) Inventors: Thomas Wunderer, Palo Alto, CA (US); John E. Northrup, Palo Alto, CA (US); Mark R. Teepe, Menlo Park, CA (US); Zhihong Yang, Sunnyvale, CA (US); Christopher L. Chua, San Jose, CA (US); Noble M. Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 29 days.

(21) Appl. No.: 13/920,248

(22) Filed: Jun. 18, 2013

(65) Prior Publication Data
US 2014/0369367 A1    Dec. 18, 2014

(51) Int. Cl.
*H01S 3/30*    (2006.01)
*H01S 5/343*    (2006.01)
*H01S 5/34*    (2006.01)

(52) U.S. Cl.
CPC ............... *H01S 5/343* (2013.01); *H01S 5/3401* (2013.01); *H01S 5/342* (2013.01)
USPC .............................. 372/5; 372/74; 372/43.01

(58) Field of Classification Search
CPC .................................. H01S 3/0959; H01S 5/04
USPC ........................................ 372/5, 64, 74, 43.01
See application file for complete search history.

(56) References Cited

U.S. PATENT DOCUMENTS

| | | | | |
|---|---|---|---|---|
| 5,349,596 A | * | 9/1994 | Molva et al. | 372/43.01 |
| 5,461,637 A | * | 10/1995 | Mooradian et al. | 372/92 |
| 5,841,802 A | * | 11/1998 | Whiteley et al. | 372/45.01 |
| 7,590,161 B1 | | 9/2009 | Hug et al. | |
| 2011/0188532 A1 | * | 8/2011 | Hata et al. | 372/50.12 |

OTHER PUBLICATIONS

Pecora, E.F., et al., "Sub-250 nm room-temperature optical gain from AlGaN/AlN multiple quantum wells with strong band-structure potential fluctuations", Appl. Phys. Lett. 100, 061111 (2012).
Kozlovsky,V.I., et al., "Electron Beam Pumped MQW InGaN/GaN Laser", MRS J. Nitride Semiconductor Research, vol. 2, Art. 38 (MRS 1997).
Moustakas, T., Abstract submitted for the MAR12 meeting of The Americal Physical Society, submitted Dec. 12, 2011.

* cited by examiner

*Primary Examiner* — Xinning Niu
*Assistant Examiner* — Vu A Vu
(74) *Attorney, Agent, or Firm* — Hollingsworth Davis, LLC

(57) ABSTRACT

A semiconductor light emitting device includes a light guiding structure, a light emitting layer disposed within the light guiding structure, and a structure for discharging excess electric charge within the device. The device may be excited by an electron beam, as opposed to an optical beam, to create electron-hole pairs. The light emitting layer is configured for light generation without requiring a p-n junction, and is therefore not embedded within nor part of a p-n junction. Doping with p-type species is obviated, reducing device loss and permitting operation at a short wavelengths, such as below 300 nm. Various structures, such as a top-side cladding layer, are disclosed for discharging beam-induced charge. A single device may be operated with multiple electron beam pumps, either to enable a relatively thick active layer or to drive multiple separate active layers. Cooperatively curved end facets accommodate for possible off-axis resonance within the active region(s).

42 Claims, 13 Drawing Sheets

STRUCTURE FOR ELECTRON-BEAM PUMPED EDGE-EMITTING DEVICE AND METHODS FOR PRODUCING SAME

STATEMENT REGARDING FEDERALLY SPONSORED RESEARCH AND DEVELOPMENT

This work disclosed herein was made with government support under W911NF-10-2-0102 AlGaN Diode Lasers on Bulk AlN (ARL-AlGaN Diode/AlGaN Compact mid UV) awarded by the Defense Advanced Research Projects Agency (DARPA). The government has certain rights in the subject matter of this disclosure.

BACKGROUND

The present disclosure is related to semiconductor lasers, and more specifically to laser devices that are pumped using an electron-beam pump source and capable of emitting at comparatively short wavelengths, and methods for making same.

For some time there has been an unmet need in the solid-state laser art for compact, efficient devices capable of emitting at increasingly shorter wavelengths. For example, the shortest emission wavelength of a laser diode (LD) demonstrated up to now operates at $\lambda=336$ nm, longer than desirable for many applications. Factors limiting the shortening of output wavelength include the efficiency in p-type doping and carrier injection, as well as material quality, among others. Frequency-doubled or -quadrupled lasers enable shortened wavelength output, but require precise alignment of optical components, are limited to very specific wavelengths, and often operate only in pulsed mode. Other UV lasers, such as excimer lasers, are limited to specific wavelengths, are very bulky and immobile, inefficient and expensive, and also operate only in pulsed mode.

SUMMARY

Accordingly, the present disclosure is directed to compact light emitting devices, such as lasers, and processes for producing same, capable of emitting at wavelengths below 300 nm. The disclosed laser devices are AlGaN-based, and pumped by an electron beam as an excitation source.

According to one aspect of the disclosure, an AlGaN-based heterostructure is designed as an edge-type emitting laser that is pumped by a linear electron beam. The laser heterostructure includes cladding layer(s), waveguide layers, and a multiple quantum well (MQW) active region to increase optical modal confinement and to achieve high modal gain. The generation of electron-hole pairs and subsequently photons, through recombination of these, is enabled by high energy electron pumping, rather than recombination of electron-hole pairs in a p-/n-junction device. Therefore, the structure may do without an otherwise-required p-doped region. This is particularly attractive in high band gap materials, because the activation energy of p-type dopants increases with the band gap and hinders the creation of high hole concentrations. As a p-type layer proximate the active region typically results in significant absorption loss, the lack of such a layer enables devices that exhibit comparatively very low optical loss.

Furthermore, a top-side cladding layer, provided in certain embodiments disclosed herein, is designed such that a metal film disposed thereover for discharging purposes does not induce high losses through absorption. Compositions and thicknesses of the individual layers are selected to allow both a low loss and high modal gain structure and at the same time and to maximize carrier localization within the MQW. The active MQW is also designed to significantly overlap with the energy deposition profile of the electron excitation. Structural layers surrounding the active MQW are of a size and material composition to allow efficient diffusion of generated carriers into the MQW.

According to one aspect of the disclosure, a semiconductor laser device comprises: a substrate; a lower cladding layer disposed over the substrate; a lower waveguide layer disposed over the lower cladding layer; an active layer such as a multiple quantum well or double-heterostructure region disposed over the lower waveguide; an upper waveguide layer disposed over the multiple quantum well layer; a discharge structure for discharging excess charge within the semiconductor laser device; and an electron beam pump disposed over the upper waveguide layer and configured to direct an electron beam through the upper waveguide layer and into the multiple quantum well region so as to initiate carrier generation and recombination and thereby generate light; the semiconductor laser device formed so as not to include a p-n junction therein, and configured for light generation without requirement for such a p-n junction.

In variations of the above, a semiconductor laser device comprises: a substrate; a lower cladding layer disposed over the substrate; and an active layer such as a multiple quantum well or double-heterostructure region disposed over the lower cladding layer. In these variations, the active layer is sufficiently thick so as to provide a wave guiding function.

Implementations of this aspect may also include an upper cladding layer, disposed over the upper waveguide layer. Furthermore, implementations may also include a contact layer disposed over the upper cladding layer, and an ohmic metal layer disposed over the contact layer. In certain implementations, the upper cladding layer, contact layer, and ohmic metal layer serve as a conduction path for conducting charge generated by the electron beam out of the device.

According to another aspect of the disclosure a plurality of laser devices may be formed, each having its own dedicated electron beam pump disposed thereover. In one alternative, a single electron beam pump may be disposed to drive more than one laser device. This may be realized by deflecting the beam in scanning or pulsed mode. In another alternative, a single light emitting device may comprise separate active regions. Multiple electron beam pumps may be disposed such that each drive one (or more) of the separate active regions. The electron beam pumps may be operated in unison or independently. In still another alternative, multiple electron beam pumps are disposed for driving a single light emitting device. The multiple electron beam pumps may be operated at different energies, such that each excites regions of an active layer at different depths. Light generation may thereby be more evenly obtained over the thickness of the active layer, and permit activation of an increased number of quantum wells.

According to yet another aspect of the disclosure, misalignment of the electron beam relative to a primary axis of the laser resonator may be accommodated. In certain implementations, this accommodation is made by provision of cooperatively curved end facets of the laser device.

The above is a brief summary of a number of unique aspects, features, and advantages of the present disclosure. The above summary is provided to introduce the context and certain concepts relevant to the full description that follows. However, this summary is not exhaustive. The above summary is not intended to be nor should it be read as an exclusive identification of aspects, features, or advantages of the claimed subject matter. Therefore, the above summary should not be read as imparting limitations to the claims nor in any other way determining the scope of said claims.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known starting materials, processing techniques, components, equipment and other well-known details may merely be summarized or are omitted so as not to unnecessarily obscure the details of the present disclosure. Thus, where details are otherwise well known, we leave it to the application of the present disclosure to suggest or dictate choices relating to those details.

While the description herein refers extensively to "laser" devices, it will be appreciated that aspects of the present disclosure are intended to be applicable to other forms of semiconductor-based, light emitting structures that may not support lasing, such as spontaneous light emitting devices (LEDs), super-luminescent LEDs (SLEDs), and the like. Reference to laser devices is therefore merely by example and unless otherwise stated, is not intended to be limiting.

In typical semiconductor lasers, the upper cladding layer comprises a higher band gap material than the active zone in order to be transparent at the lasing wavelength yet able to support the current required for high carrier injection. In particular, for LDs emitting in the ultraviolet spectral range this becomes quite challenging, because the activation energy of the p-dopants increases with the band gap of the materials and high p-type conductivity is difficult to achieve. This has heretofore limited lowering the wavelength of device output below 336 nm. Optical pumping can achieve lower wavelength outputs from solid state laser devices. However, the optical source (e.g., gas laser) for these systems is relatively quite large and prohibits use in many compact systems. As disclosed herein, an electron beam source may be fabricated as a compact package, and can be employed as a pump source to obtain a compact laser system able to emit below 336 nm.

As a very specific example, we describe two embodiments of laser heterostructures with the same target emission wavelength in the UV-C spectral range. Other compositions, materials, layer thicknesses, number of quantum wells, etc. might be used as well to fabricate laser devices emitting at a wide range of wavelengths. The numeric values and ranges provided for various aspects of the implementations are to be treated as examples only.

Figure 1:
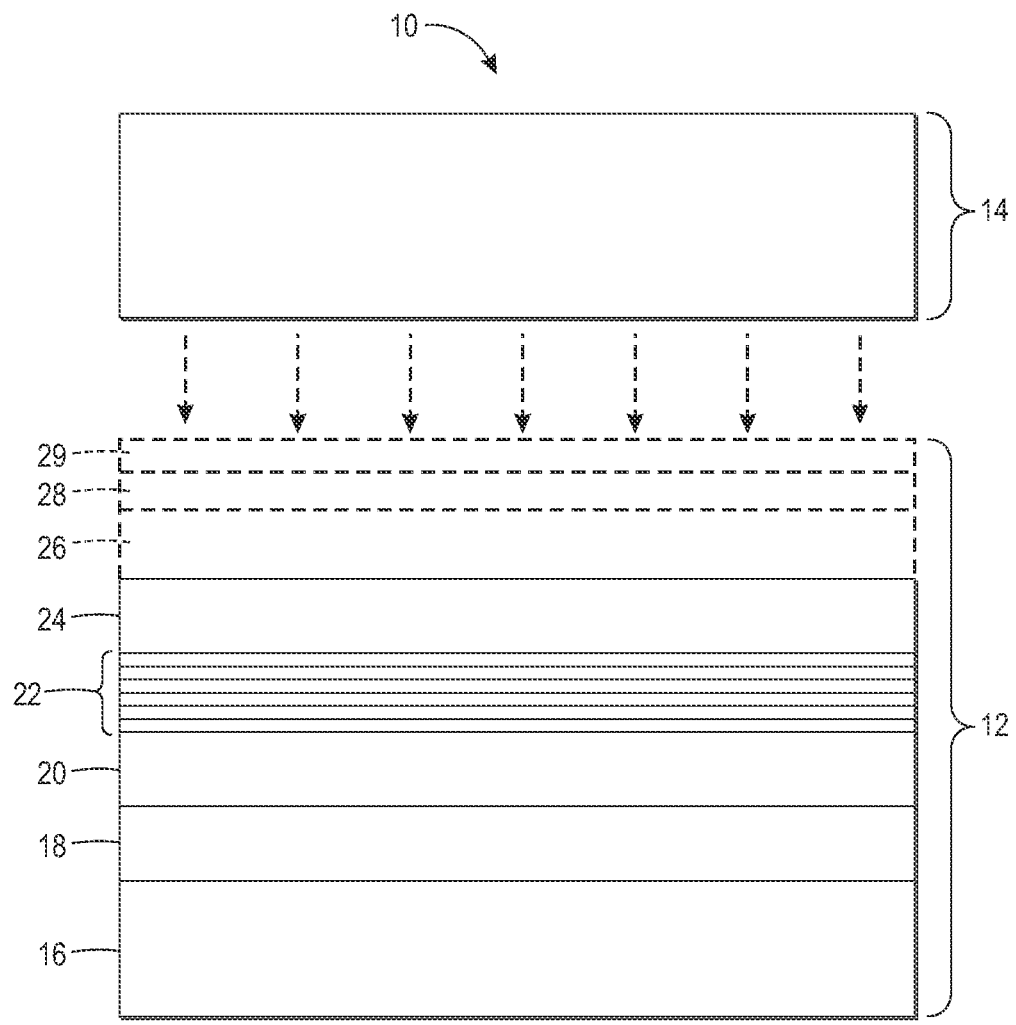
FIG. 1 is a side-view of a semiconductor laser structure according to one embodiment of the present disclosure.

With reference to FIG. 1, a system 10 comprising a semiconductor laser structure 12 and electron-beam pump source 14 according to one embodiment of the present disclosure of is shown. Semiconductor laser 12 comprises a substrate 16, such as AlN or GaN. Above substrate 16 is formed a lower cladding layer 18 of $Al_xGa_{1-x-y}In_yN$ where x is between 0.6 and 1 and y is between 0 and 0.03, for example n-$Al_{0.74}Ga_{0.26}N$.

A lower waveguide 20 may be formed over lower cladding layer 18 of $Al_zGa_{1-z-y}In_yN$ where z is between 0.5 and 1 and y is between 0 and 0.03, and z<x. For example, lower waveguide 20 may comprise n-$Al_{0.7}Ga_{0.3}N$ (40 nm thick).

An active layer 22, such as a multiple quantum well heterostructure (MQW) or double heterostructure (DH) region may be formed over lower waveguide 20. Active layer 22, in the case of a MQW, may comprise pairs of $Al_xGa_{1-x}N$/$Al_yGa_{1-y}N$ of varying thickness (e.g., 5 layer pairs of $Al_{0.57}Ga_{0.43}N$/$Al_{0.62}Ga_{0.38}N$, 5.4 nm and 9.6 nm, respectively). In general, active layer 22 may comprise at least one layer of $Al_uGa_{1-u-v}In_vN$ where v is between 0 and 0.03, and 0.4<u<z. In the case of a MQW, in general the barrier may be $Al_sGa_{1-s-t}In_tN$, where 0.4<u<z and s>u+0.04, and t is between 0 and 0.03. In such a case, the quantum well thickness may be between 1 and 6 nm and the barrier thickness may be between 3 and 20 nm.

An upper waveguide 24 may be formed over active layer 22, comprising, for example, n-doped AlGaN (such as 40 nm of n-$Al_{0.7}Ga_{0.3}N$), undoped AlN, and so on.

Optionally, upper cladding layer 26 may be formed over upper waveguide 24. (Optional layers, elements, and features for various embodiments may be indicated with dashed outlines.) When fabricated without an upper cladding layer, upper waveguide 24 is formed to be relatively thick, on the order of about 200 nm for example. When fabricated with upper cladding layer 26, layer 26 may comprise n-doped AlGaN (such as having at least 70% Al, for example n-Al$_{0.78}$Ga$_{0.22}$N, 220 nm thick). In some embodiments, such as at very high Al concentration, the upper cladding layer 26 may be undoped. In some embodiments, at least one of the lower cladding layer, lower waveguide layer, light emitting layer, upper waveguide layer, or upper cladding layer is doped n-type.

Figure 15:
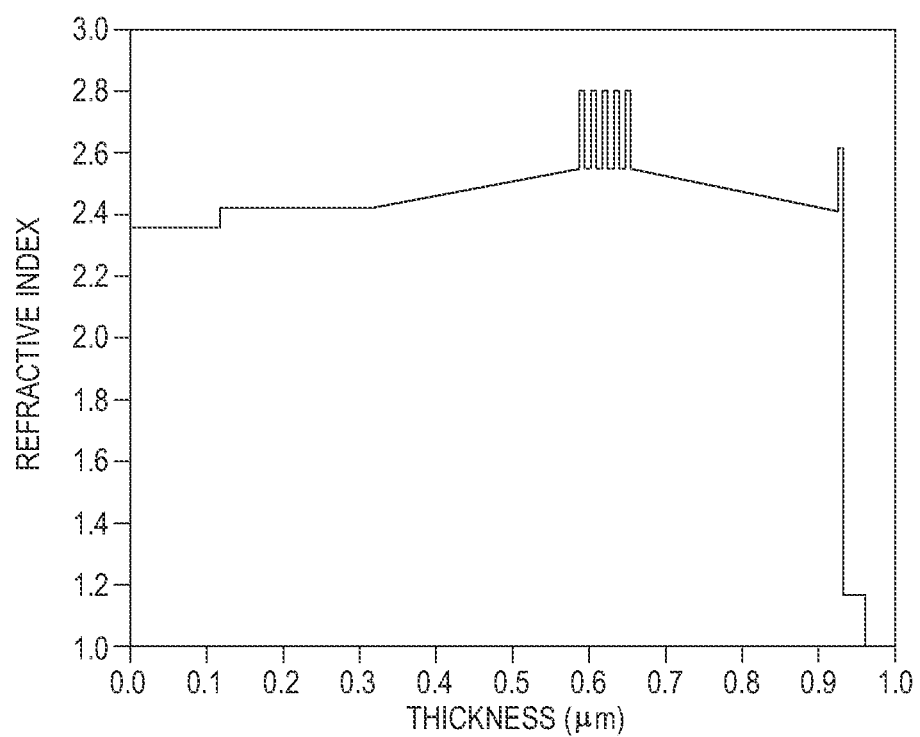
FIG. 15 is a plot of refractive index versus thickness for a sample device having a graded composition cladding according to an embodiment of the present disclosure.

Optionally, in certain embodiments, at least one of the lower cladding layer, lower waveguide layer, light emitting layer, upper waveguide layer, and upper cladding layer is a short-period superlattice. In addition, in certain embodiments, at least one of the lower cladding layer, lower waveguide layer, upper waveguide layer, or upper cladding layer may be a monotonically-varying alloy-compositional gradient, with the lower band gap composition of the graded layer nearest the light emitting layer (such as illustrated in FIG. 15 and discussed further below).

Also optionally, a contact layer 28 may be provided over upper cladding layer 26. Contact layer 28 may comprise n-GaN as one example. A suitable ohmic metal layer 29 may be formed over contact layer 28 (such as 30 nm of Ti) to permit conduction of charge from the laser device, discussed further below.

It will be appreciated that at relatively high thicknesses of active layer 22, active layer 22 may itself provide a wave guiding function, obviating the need for a separate lower waveguide 20 and/or upper waveguide 24, and otherwise providing a light guiding layer. Thus, in certain embodiments lower and upper waveguides form a light guiding structure within which a light emitting layer is disposed. In other embodiments, the thickness and other characteristics of the light emitting layer provide light guiding at upper and lower margins, thereby also forming a light guiding structure within which a light emitting layer is disposed.

Electron-beam pump source 14 is disposed to be over, and in some embodiments, spaced apart from a top surface of semiconductor laser 12. Electron-beam ("e-beam") pump source 14 is connected to a driving voltage such that it produces a line-pattern (e.g., 12 μm×500 μm) electron beam in a direction toward and into the top surface of semiconductor laser 12.

Figure 2:
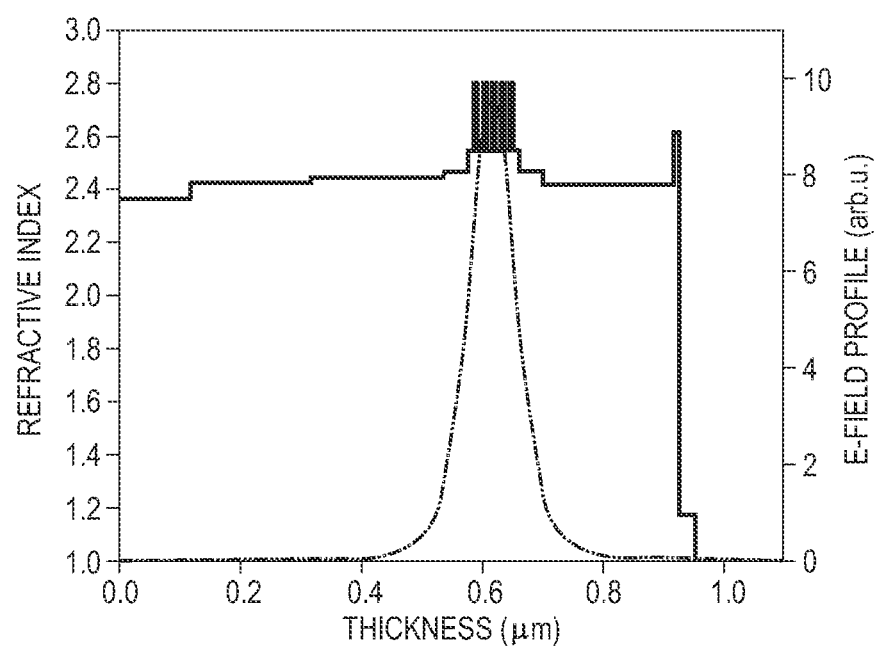
FIG. 2 is a plot of refractive index and field profile versus thickness for a sample device according to an embodiment of the present disclosure.

The structure described above has been built and modeled. Emission wavelengths for such a structure may be obtained, depending upon materials and compositions, for example in the range of 200 nm to 365 nm. FIG. 2 is an illustration of the modeling of the structure for a target emission wavelength at λ=265 nm. For the model, the structure includes a 220 nm thick n-Al$_{0.78}$Ga$_{0.22}$N top cladding layer, a 5 nm thick n-GaN contact layer, and a 30 nm thick Ti metal top contact/discharge layer. As can be seen from FIG. 2, the refractive index for the various layers is shown, as is the optical mode (i.e., e-field of the lasing mode) profile. In the ideal case, the carrier generation peaks at the center of the MQW, in order to most efficiently generate photons therein. The model of FIG. 2 predicts a comparatively high Γ, on the order of 25%, and a comparatively low loss of less than 1 cm$^{-1}$.

Figure 3A:
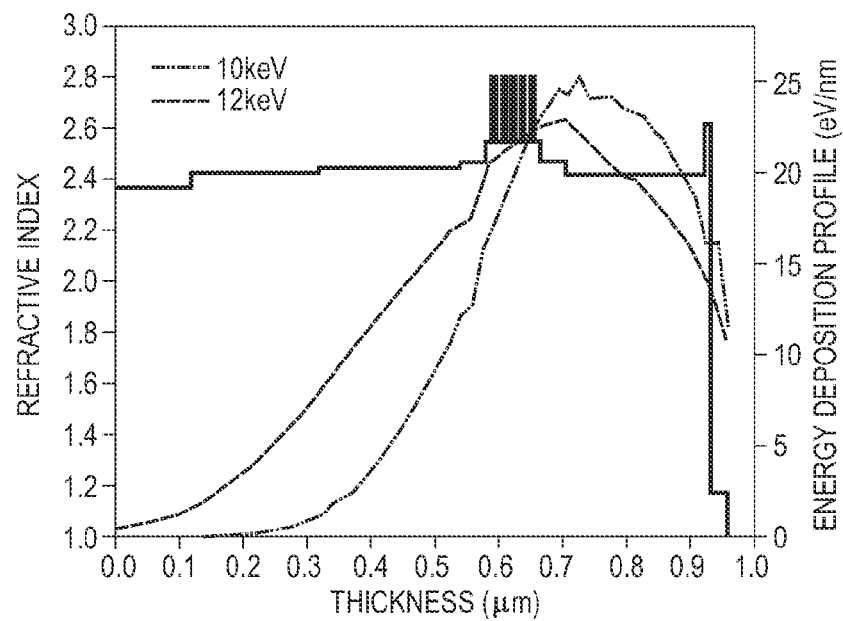
FIG. 3A is a plot of refractive index and energy deposition profile versus thickness for the sample device of FIG. 2.

FIG. 3A is a graph of the modeling of the structure of FIG. 2, showing calculated energy deposition profile versus depth into the semiconductor laser structure for two selected e-beam energies. As can be seen from FIG. 3A, for 10 keV and 12 keV, about 32 percent and 30 percent of the total energy, respectively, is deposited into the MQW region and waveguide layers (upper and lower). The rate of electron-hole generation at a given depth is proportional to the energy deposition at that depth. The more energy that is deposited into these regions, the higher the expected laser output power.

Figure 3B:
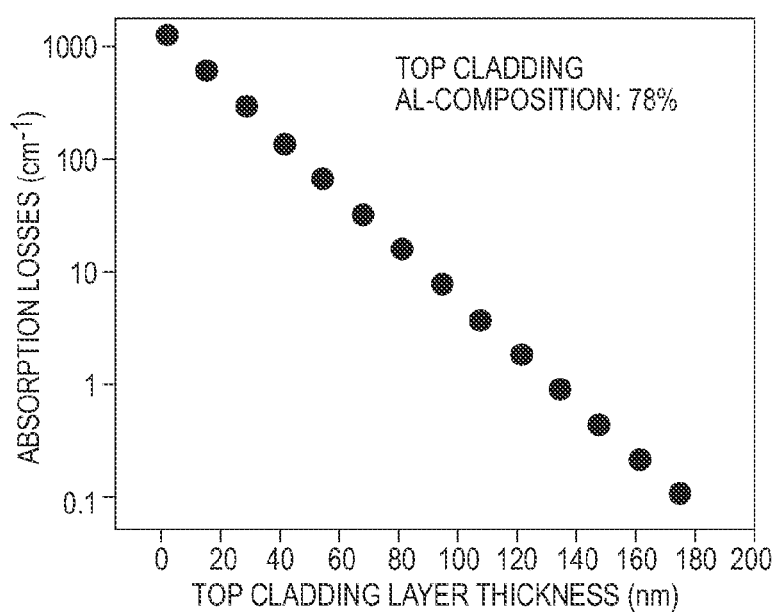
FIG. 3B is a plot of absorption loss against top cladding thickness for the sample device of FIG. 2.

The effect of cladding layer thickness on absorption losses for this structure is illustrated in FIG. 3B. It can be seen from FIGS. 3A and 3B that a thicker cladding layer limits the depth of the peak of the energy deposition profile yet provides lower absorption loss, and conversely a thinner cladding layer permits a deeper peak of the energy deposition profile (e.g., closer to the active region) yet results in higher absorption loss. From data such as provided in FIGS. 3A, 3B, design parameters may be chosen as a function of the specific application of the teachings of the present disclosure to permit balancing and ultimately optimizing both the energy deposition profile of the electron beam and the absorption losses induced mainly by the top surface layers (contact layer, top metallization).

The results shown in FIGS. 2 and 3A, 3B support the operability and advantages of a laser structure, such as that described above, that operates without an upper p-doped layer. Again, one significant advantage provided thereby is elimination of a p-doped layer with high electrical conductivity and low absorption losses that is very challenging to fabricate for high band gap materials.

We have selected an electron beam as an excitation source to take advantage of the fact that generation of carriers by electron beam means that carrier generation and injection does not rely on a p-/n-junction. This obviates the challenge of forming a highly conductive (p-type) material in high band gap semiconductors that is able to carry the current densities necessary for laser emission. Thus, no p-type doping of an upper cladding layer is required. In addition, carrier injection by e-beam is comparatively deep, extending beyond the top most MQW layers. This homogeneous carrier injection supports an increased number of quantum wells in the MQW layer than typically is achieved in a laser diode. Higher gain and improved device performance are thereby provided.

E-beam pumping produces a net charge within the laser structure. Thus, the laser heterostructures and the device architectures disclosed herein include features to allow effective discharge of the device, e.g., it includes conductive layers that are n-doped (and may include p-doped layers), metal films and/or contacts and connections to ground or the anode of the e-beam source. In the example above, an n-type upper cladding and metal ohmic contact are provided over the MQW, solely for this discharge function. However, it will be understood that this is simply one example of a family of structural configurations in which an upper p-type cladding is obviated by e-beam pumping. Many variations are contemplated herein.

Figure 4:
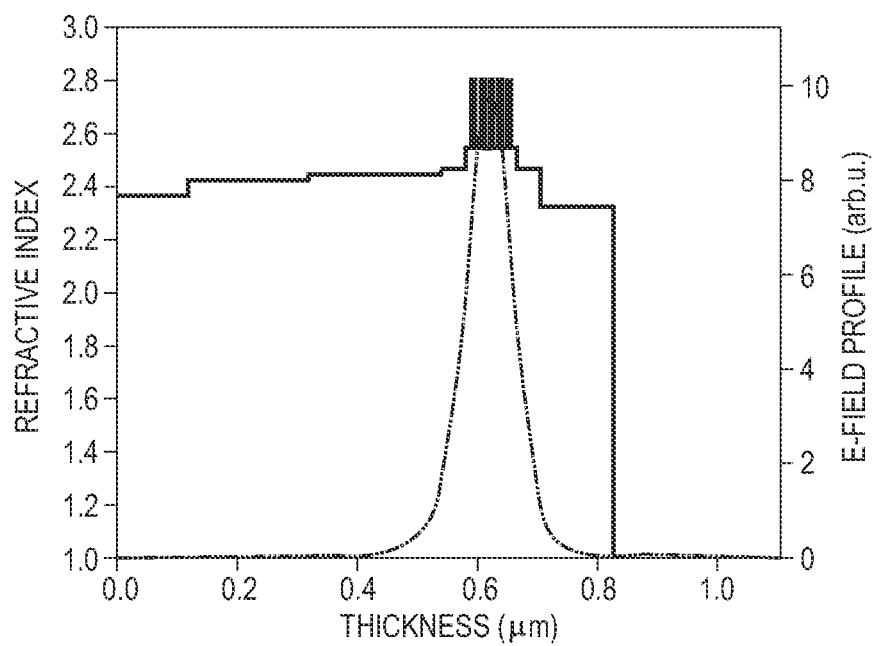
FIG. 4 is a plot of refractive index and field profile versus thickness for a sample device according to another embodiment of the present disclosure.
Figure 5A:
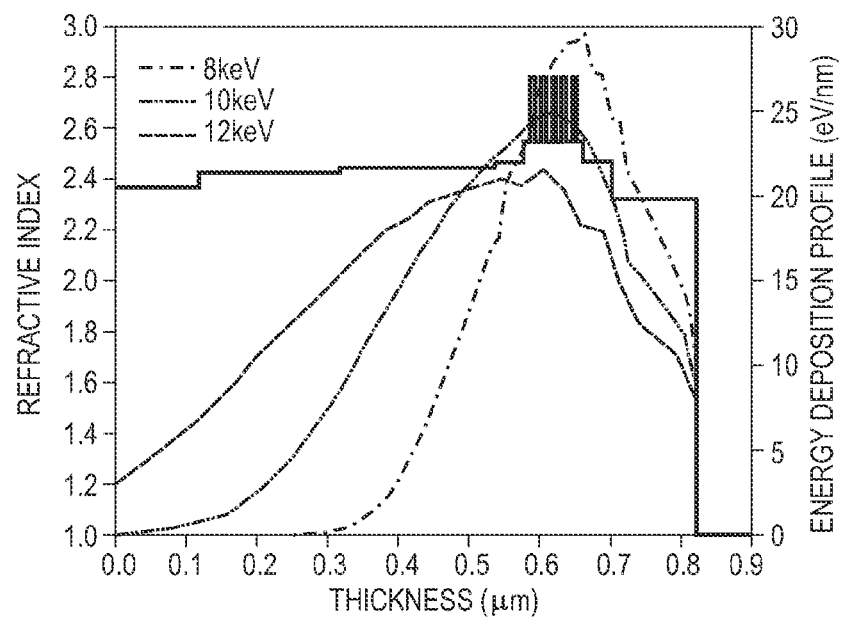
FIG. 5A is a plot of refractive index and energy deposition profile versus thickness for the sample device of FIG. 4.
Figure 5B:
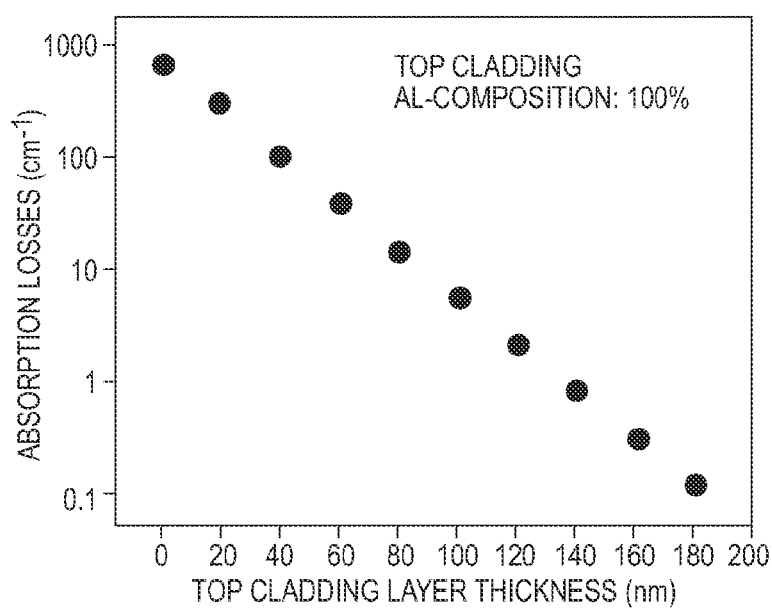
FIG. 5B is a plot of absorption loss against top cladding thickness for the sample device of FIG. 4.

For example, FIG. 4 shows an alternative semiconductor laser design for electron beam pumped operation at a target emission wavelength of λ=265 nm, and FIG. 5A shows calculated e-beam energy deposition profile for that design. FIG. 5B illustrates the effect of cladding layer thickness on absorption losses for this structure. The structure modeling in FIGS. 4 and 5A, 5B is similar to that of FIGS. 2 and 3A, 3B, with the exception that the structure of FIGS. 4 and 5A, 5B has an undoped 120 nm thick AlN top cladding layer and a lack of any contact layer and upper ohmic metal layer. Noteworthy is the result that lower absorption losses may be obtained for a thinner top cladding layer as compared to the structure of FIGS. 2 and 3A, 3B. The energy profile peak may therefor occur closer to the active region. The lack of upper contact layers means that discharge of the device, a required function of an e-beam pumped laser, is provided not via the top surface, but instead through the n-AlGaN lower cladding layer and/or laterally via mesa side contacts, as an option.

The laser heterostructure in the prior example was designed to allow discharge via its top surface. Therefore the AlGaN composition of the cladding layer was limited to provide sufficiently high conductivity (e.g., the Al-composition is 78%). To avoid high absorption losses through the GaN cap layer and/or metal contact, the cladding layer in that example was chosen to be relatively thick, on the order of 220 nm. In the present example, however, there is no concern with regard to conductivity of the upper cladding layer, so it may be entirely non-conductive AlN. Furthermore, by reducing the thickness of the AlN upper cladding later, carrier generation and confinement within the MQW active region is improved. Thus, the upper cladding layer was selected, as an example here, to be on the order to 120 nm thick.

In order to provide a discharge path for the device illustrated in FIG. 4, etching is performed to form a mesa structure, with the lower cladding layer exposed for electrical contact. Metal may be deposited on selected portions of the exposed surfaces, either at the bottom of the etched region adjacent the device or the sidewall of the device, or both, for the requisite conduction path. Again, no GaN contact layer or top metal is needed. The waveguide simulations produce a comparatively high Γ, on the order of 25%, and a comparatively low loss of less than 1 cm$^{-1}$.

The energy deposition profiles of the excitation source are shown in FIG. 5 for excitation energies of 8, 10, and 12 keV. This produced 52, 41, and 28% of the total energy is deposited into the active zone and waveguide layers for 8, 10, and 12 keV, respectively. The absolute deposited energy in the active zone and waveguide layers, with the same current for the different excitation energies, is very similar for 8 and 10 keV and about 20% less for 12 keV.

Figure 6:
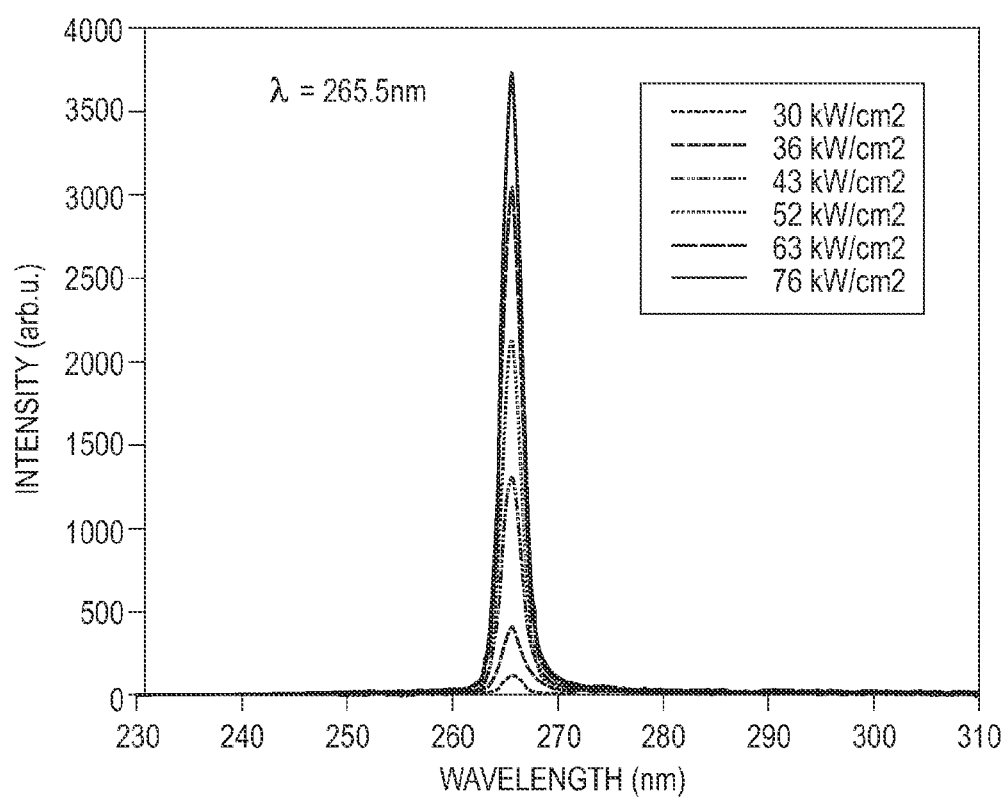
FIG. 6 is a graph of the laser spectra that was optically pumped using a KrF excimer laser for a variety of excitation powers for a sample laser structure according to an embodiment of the present disclosure.
Figure 7:
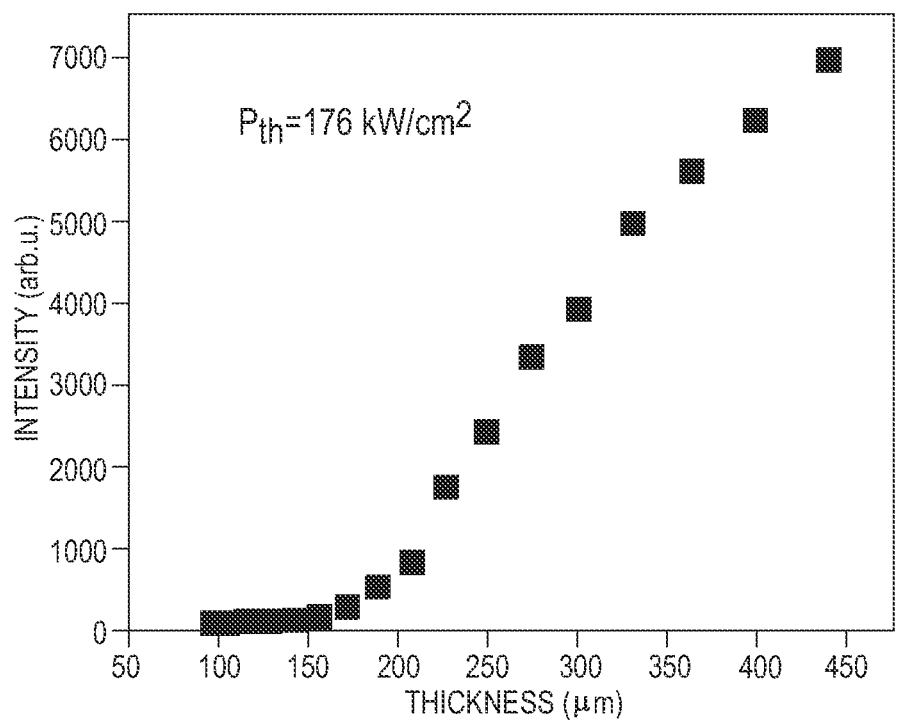
FIG. 7 is a graph of the output versus power density for the sample laser structure of FIG. 6.

For laser heterostructures emitting in the UV, we have demonstrated the growth and fabrication of heterostructures using MOVPE on bulk AlN substrates, and achieved excellent laser performance. These structures have been operated as optically pumped lasers for the purpose of investigating the fundamental structural characteristics and emission performance. FIG. 6 is a graph of the laser spectra for a variety of excitation powers for a sample laser structure. A KrF excimer laser was used as an excitation source. Emission was at λ=265 nm. FIG. 7 is a graph of the output versus power density for the same sample laser structure. The device exhibits excellent performance, comparable to state-of-the-art devices in the visible regime (i.e., using InGaN/GaN quantum wells).

Figure 8:
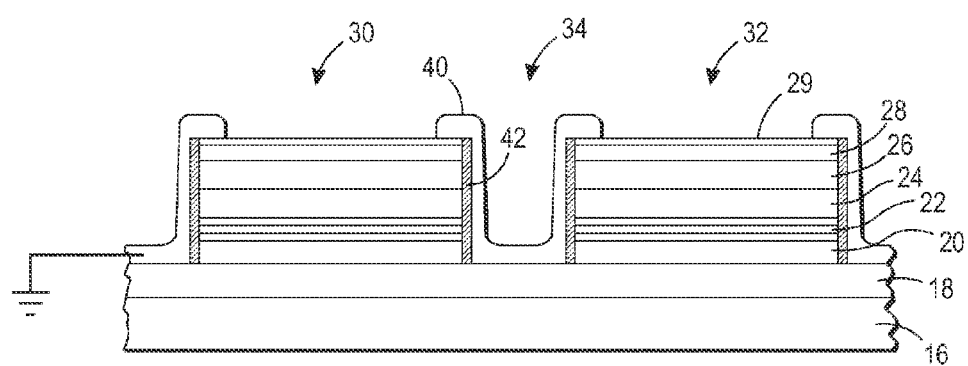
FIG. 8 is a side-view of two semiconductor laser structures, including conduction path metallization, according to an embodiment of the present disclosure.

An individual device or array of devices may be formed on a substrate, having the layer composition illustrated in FIG. 1. A structure may be formed with such a layer composition, and then etched to form individual devices. Two such devices 30, 32 are shown in FIG. 8, separated by an etched region 34. A dry etch, for example using chemically assisted ion beam etching (CAIBE) or inductively-coupled plasma reactive ion etching (ICP-RIE), facet cleaving, or other processes known in the art may be used to form both the etched region 34 as well as the laser facets. Etching may proceed into the lower cladding layer 18, exposing that layer. A contact metal 40 (for example, a layered structure of Ti(20 nm)/Al(100 nm)/Ni(45 nm)/Au(60 nm) annealed at about 900° C. for roughly one minute, which forms a functional ohmic contact to the n-type AlGaN) may then be formed over portions of devices 30, 32, and within etched region 34 to form a conduction path for discharging the devices (e.g., tied to ground). Optionally, sidewall passivation 42 may be formed on the sidewalls of devices 30, 32 prior to forming contact metal 40.

Figure 9:
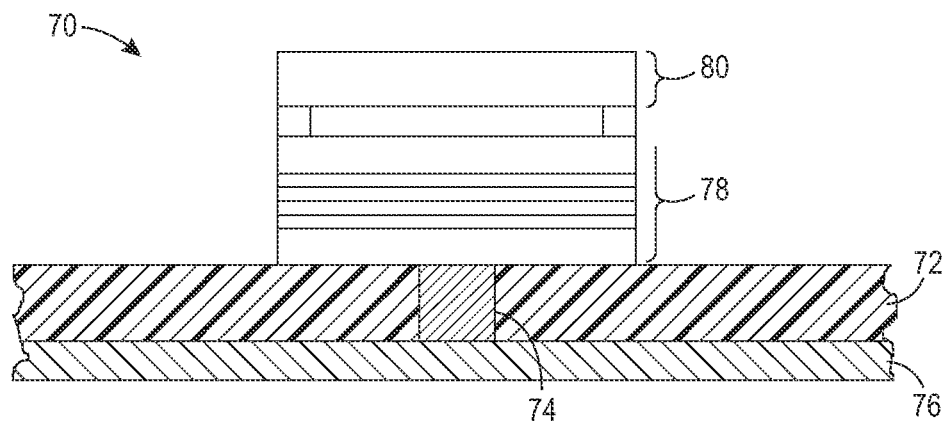
FIG. 9 is a cut-away side view of a light emitting device having a substrate and via connection to a discharge structure, according to an embodiment of the present disclosure.

While the previous embodiment forms a discharge path using a deposited metal in etched regions between devices, in other embodiments, direct contact to the ohmic metal layer 29 may be made to each device, or groups of devices, for discharging. As mentioned, contact layer 29 is relatively thin, on the order of 30 nm for a material such as Ti, such that the electron beam may easily penetrate into the active region of the device. Similarly, a backside metal layer may be provided for electrical and thermal discharge. One such device 70 is illustrated in FIG. 9. Device 70 comprises a substrate 72 having a via 74 formed therein, and a conductive discharge structure 76 disposed on a first surface. A light emitting device 78 is disposed on a second surface of substrate 72 opposite the surface on which the light emitting device 78 is disposed. Via 74, or more precisely, conductive material disposed in via 74, electrically interconnects conductive discharge structure 76 and device 78 such that charge that may accumulate in device 78 due to electron beam pumping from electron beam pump 80 may be discharged through structure 76, such as to ground potential. Many other discharge structures are contemplated hereby, including one or more conductive intermediate layers, sidewalls, and so on.

Figure 10:
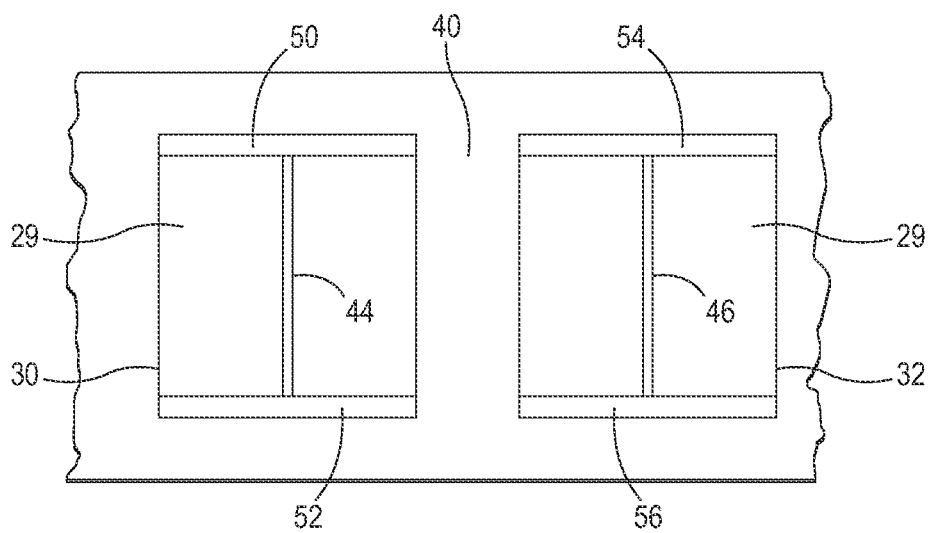
FIG. 10 is a top-view of the two semiconductor laser structures, including conduction path metallization, according to the embodiment of FIG. 8.

Following the formation of devices 30, 32, individual electron beam sources may be formed or disposed over each device. According to one embodiment, prefabricated electron beam sources are selected to have a beam length comparable to the length of the resonance cavity (between facets 50, 52 of device 30 and facets 54, 56 of device 32), for example on the order of 300-500 μm. Indeed, the length of the resonator is primarily limited by the output format of the electron beam source. FIG. 10 illustrates a top-view of devices 30, 32, with the position of an electron beam on each device indicated by lines 44, 46, respectively.

The resulting device may be operated in vacuum. According to certain embodiments, the output power density may be in the range of 100 kW/cm2 to about 1-2 MW/cm2. The acceleration voltage may be on the order of 10 kV. The spot size may be on the order of 12×500 microns. That is, current is on the order of 0.6 mA to 6-12 mA, with a higher current producing a higher the output power. Again, these ranges are merely one set of examples, and other ranges are also contemplated by the present disclosure.

Figure 11:
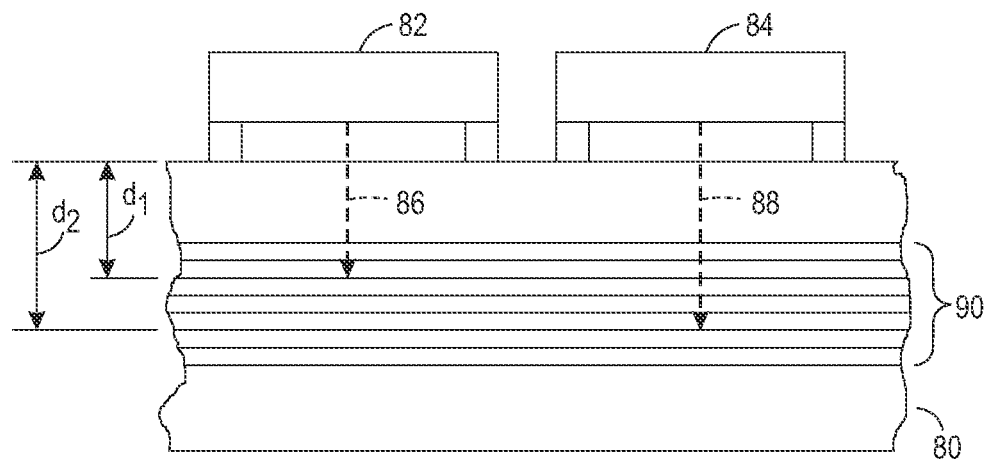
FIG. 11 is a cut-away side view of a light emitting device having multiple electron beam sources according to an embodiment of the present disclosure.

In certain embodiments, a single electron beam source will be associated with a single light emitting device. The energy deposition profile depends on the energy of the electron beam. By increasing the energy of the electron beam it becomes possible to excite regions having a greater depth below the surface of the device. This is illustrated in FIG. 11, for a single light emitting device 80 having two electron beam sources 82, 84 disposed thereover.

First source 82 provides a lower energy electron beam 86, which extends to a depth $d_1$, than second source 84, and second source 84 provides a higher energy electron beam 88, which extends to a deeper depth $d_2$, than first source 82. These multiple energy e-beams excite electron-hole pairs at different depths, so that the electron-hole pair density is more evenly distributed within the extended light emitting region 90. In other words, each electron beam will have a penetration depth profile that corresponds to the energy of the electron beam. That depth profile will have a peak at a given depth, so placing the active layer at this depth (or selecting the energy for a known depth) would allow optimal activation. However, the electron beam energy deposition drops below its peak value with depth, so multiple electron beam energies may uniformly activate the active layer, particularly when the active layer is comparatively thick. Hence, according to this embodiment, the multiple, different energy electron beams also allow uniform pumping of a light emitting region having an increased number of wells. (Of course, in other embodiments the two sources 82, 84 may also provide the same electron beam power, with the depth of the deposition profile being roughly the same for each.)

Figure 12:
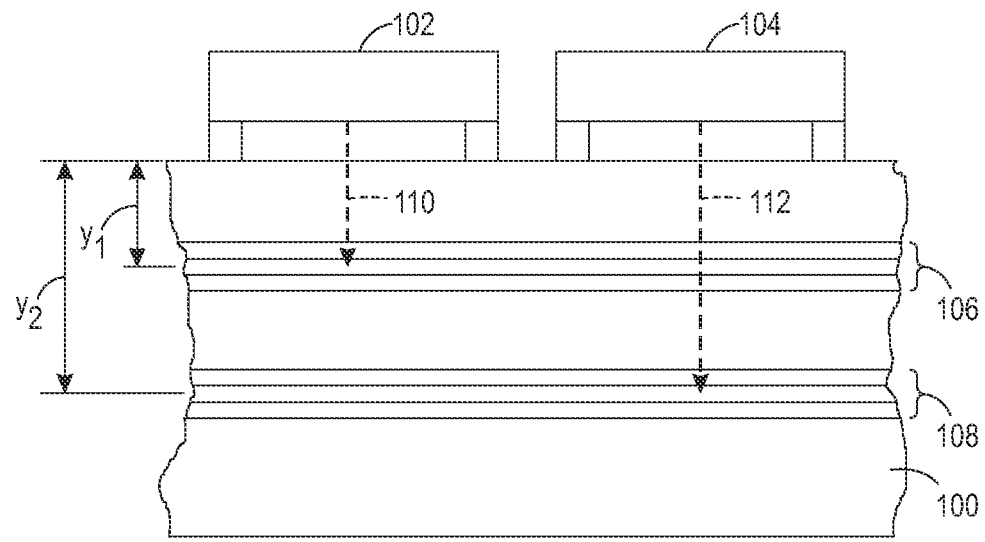
FIG. 12 is a cut-away side view of a light emitting device having multiple electron beam sources according to another embodiment of the present disclosure.

In still further embodiments, a light emitting device may be fabricated with two or more active regions, each of a different composition or otherwise fabricated to emit at different wavelengths. This is illustrated in FIG. 12. Again, a single light emitting device 100 is provided, having two electron beam sources 102, 104 disposed thereover. Light emitting device is formed to have two separate active regions 106, 108, arranged vertically at different depths.

First source 102 provides a lower energy electron beam 110, which extends to a depth $y_1$, than second source 104, and second source 104 provides a higher energy electron beam 112, which extends to a deeper depth $y_2$, than first source 102. Sources 102, 104 excite electron-hole pairs at different depths, and hence in different active regions 106, 108, respectively. According to this embodiment, the multiple electron beams allow generation of light at different wavelengths. Multiple and switched wavelength outputs are provided, particularly when sources 102, 104 are operated independently.

Alternatively, a single electron beam source, such as 102 or 104, may be provided, as above, and operated at two different energies (such as operating voltages) such that for each energy a different energy deposition profile is obtained. Each different energy deposition profile will peak at a different depth within the device. Thus, at a first operating energy, recombination may take place in a first active region resulting in emission at a first wavelength, and at a second operating voltage, recombination may take place in a second active region resulting in emission at a second wavelength different than the first wavelength. Wavelength-switched operation may thereby be obtained.

Figure 13:
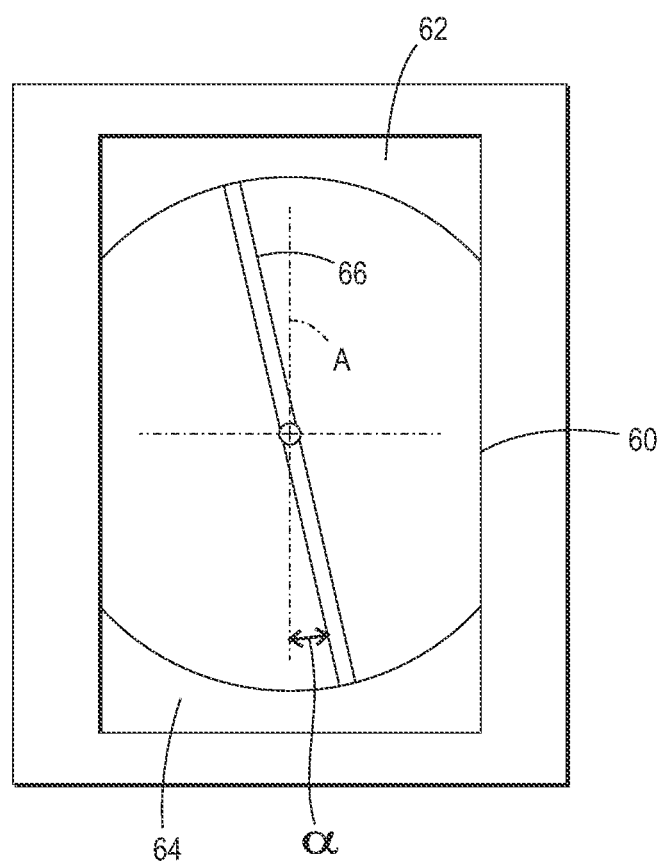
FIG. 13 is a top view of a semiconductor laser structure, including an indication of the position of a rotationally misaligned linear electron beam, and curved facets for addressing same, according to an embodiment of the present disclosure.
Figure 14:
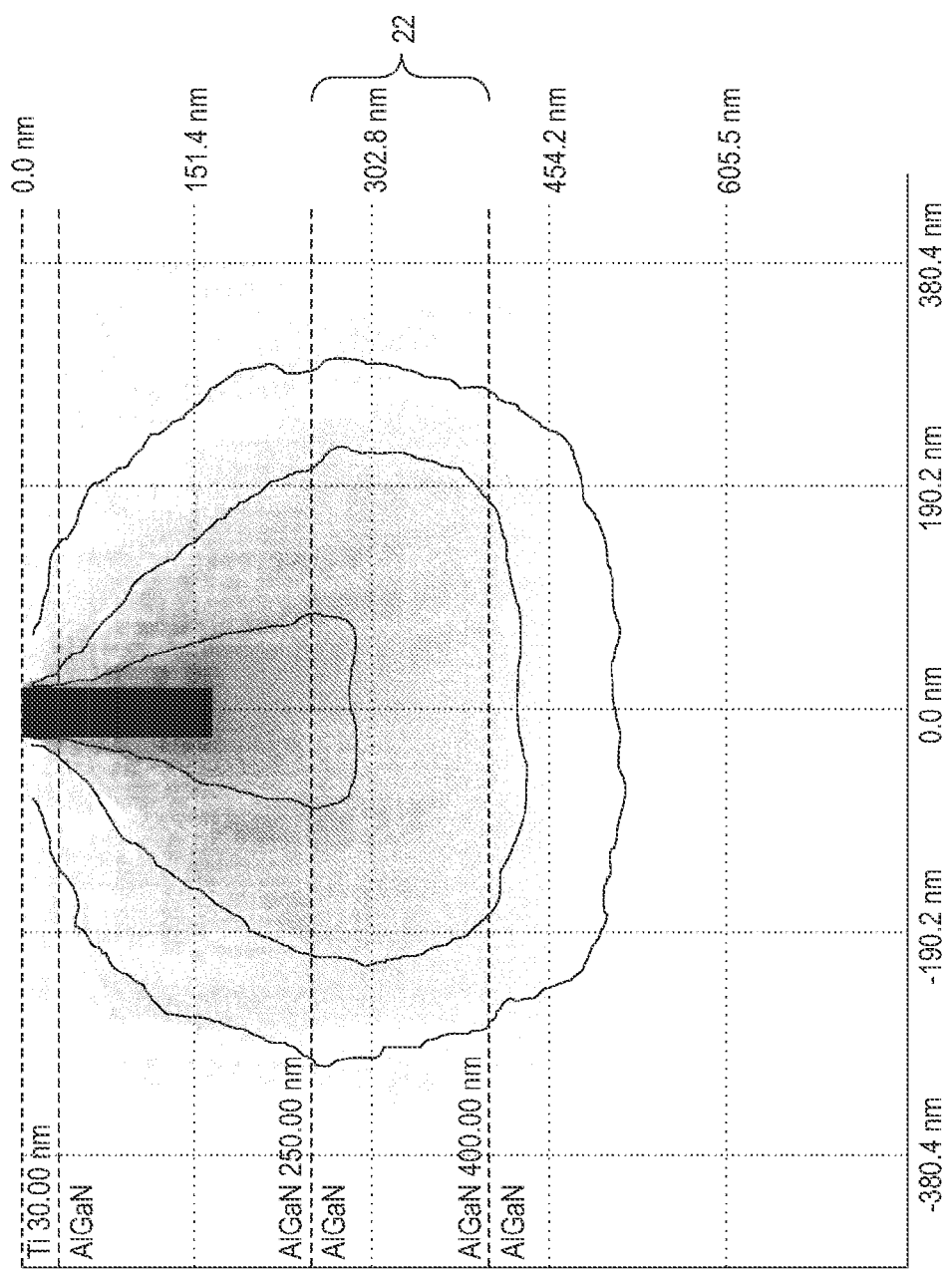
FIG. 14 is an energy loss map for an electron beam injection, showing the depth of injection into an active MQW region, according to an embodiment of the present disclosure.

As will be appreciated, rotational alignment of the electron beam relative to the planes of the facets of the laser devices will affect device performance. Ideally, the long axes of the electron beams (lines 44, 46) are normal to the planes of facets 50, 52, and 54, 56, respectively. However, given that in certain embodiments the electron beam sources are prefabricated, and secured over the laser devices, the possibility of misalignment is introduced. In order to address this, the laser devices may be formed with cooperatively curved facets such that off-axis resonance within the lasing cavity is supported. An example of such a device 60 is shown in FIG. 13, with curved facets 62, 64, to accommodate rotational misalignment (by an amount a from a primary axis A extending between facets 62 and 64) of electron beam 66. Many different curvatures and profiles are possible to achieve this result.

A radius of curvature that is half the length of the resonator length may be selected. That is, the facets maybe provided with a generally round curvature (in plan view), with the origin in the center of the device. Any angular or rotational misalignment is therefore accommodated. The photons always experience proper and desirable feedback, provided the resonant beam travels through the center of the device.

It will be understood from the above that a benefit of incorporating an electron beam as an excitation source is that, in contrast to a laser diode, carrier generation and injection do not rely on a p-n junction (and interface between p-type material and n-type material). This addresses the significant challenge of creating highly conductive (p-type) layers in high bandgap materials that are able to carry the current densities necessary for laser emission.

In addition, in traditional p-/n-junction devices, carrier injection into the active zone is typically problematic. In typical devices, the top-most quantum wells of the MQW region see a greater injection than the lower wells, and injection distribution in inhomogeneous. This often limits the number of quantum well layers formed in a semiconductor laser device, which affects device performance. However, according to the teachings of the present disclosure, a lasing structure may be produced requiring no p-type doping. Very homogeneous generation and deep injection into the active zone can be achieved. This is illustrated in FIG. 13, showing an energy loss map for an e-beam injection of 10 keV, with the active MQW region 22 indicated.

While the above description has focused on structure compositions to produce devices with a target wavelength of $\lambda=265$ nm, other compositions (e.g., AlGaN), materials (e.g., InGaN) and material systems (group III-arsenides, group III-phosphides, group II-VI systems, etc.) can be substituted to obtain one or more of a wide range of target emission wavelengths, as will be appreciated by one skilled in the art from disclosure herein. Furthermore, in an alternative embodiment of the invention, one might only use a thick top waveguide that is optimized for e-beam energy deposition without using a top cladding layer. In another alternative embodiment, the top cladding layer may be realized using low-loss non-epitaxial materials (e.g., $Al_2O_3$). Additional features known to those skilled in the art of laser diodes to manipulate the spectral quality, threshold or output power may be implemented. These include, but are not limited to, distributed feedback elements (e.g., etched grating into the surface, metal grating on the surface, compositional grating in the material, etc.), mirror coatings (e.g., high-reflectivity coatings, etc.), ridge waveguide structures, etc.

Also, as previously mentioned, in the embodiments described above, each laser device has associated with it a dedicated e-beam source. However, according to contemplated variations of the present disclosure, a single scanning e-beam may be configured to pump multiple separate devices, or compositionally different laser heterostructures to product a multiple wavelength output structure.

It will be appreciated that many aspects of known light emitting device design and configuration may be associated with the devices of the type disclosed herein. For example, in certain embodiments, mirror coatings may be applied to one or both facets of a light emitting device of the type disclosed herein. Mirror coatings may allow a reduction in the threshold of the device due to reduced mirror losses.

Furthermore, in certain embodiments, devices of the type described above may be realized as distributed feedback devices (DFB), with the goal of achieving single longitudinal mode of emission. The structure is configured with step-wise modulation of the refractive index (real/imaginary) along the resonator. For the real part of the refractive index, this may be realized by etching a grating into the semiconductor. For the imaginary part, the absorption can be modulated by using a metal grating on the surface, for example. The period for one grating element (high and low refractive index) would be $\lambda$ n/2.

The structures discussed above, have each included step-wise changes in composition and hence refractive index from one layer to the next. However, in embodiments contemplated herein, a structure may be provided that includes one or more layers, such as a lower cladding, having a monotonically-varying alloy-compositional gradient, with the lower band gap composition of the graded layer nearest the light emitting layer, such as illustrated in FIG. 15.

It should be understood that, unless specifically stated otherwise, when a first layer is referred to as being "on" or "over" a second layer or substrate, it can be directly on the second layer or substrate, or on an intervening layer or layers may be between the first layer and second layer or substrate. Further, when a first layer is referred to as being "on" or "over" a second layer or substrate, the first layer may cover the entire second layer or substrate or a portion of the second layer or substrate.

Furthermore, all the compositions and layer thicknesses, the number of quantum wells, and other details of the embodiments described above are considered as examples. Ratios of compositions, elements forming compositions, dimensions of layers and of complete structures, and so on are provided solely to illustrate examples from the family of devices enabled by the present disclosure, and are limited only by the scope of the claims herein.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may be used herein in association with a description or claim limitation (although consideration for variations and imperfections is not restricted to only those limitations associated with that term). While as difficult to precisely define as the limitations of the present disclosure themselves, we intend that "substantially" be interpreted as "to a large extent", "as nearly as practicable", "within technical limitations", and the like.

Therefore, the foregoing description provides those of ordinary skill in the art with a convenient guide for implementation of the disclosure, and contemplates that various changes in the functions and arrangements of the described examples may be made without departing from the spirit and scope of the disclosure defined by the claims thereto.

What is claimed is:

1. A semiconductor device for stimulated emission, comprising:
    a substrate;
    a light guiding structure disposed over said substrate;
    a light emitting layer disposed within the light guiding layer;
    a discharge structure for discharging excess electric charge within said semiconductor device for stimulated emission, wherein the discharge structure comprises:
        an n-doped conductive layer; and
        (a) a metal film; or (b) a metal contact; or (c) a connection to ground; or (d) a
        connection to an anode of an e-beam source;
    the semiconductor device for stimulated emission configured to be electrically excited by an incident electron beam to create electron-hole pairs, wherein their recombination predominantly occurs in the light emitting layer to thereby generate light; and
wherein said light emitting layer is not embedded within a p-n junction and further wherein said light emitting layer is configured for light generation without requirement for said p-n junction.

2. The semiconductor device of claim 1, wherein the substrate comprises bulk, single-crystal material selected from the group consisting of: AlN or GaN.

3. The semiconductor device of claim 1, wherein said light guiding structure comprises:
    a lower cladding layer;
    a lower waveguide layer disposed over said lower cladding layer; and
    an upper waveguide layer;
    wherein said light emitting layer is disposed over said lower waveguide, and further wherein said upper waveguide layer is disposed over said light emitting layer.

4. The semiconductor device of claim 3, further comprising an upper cladding layer disposed above said upper waveguide layer.

5. The semiconductor device of claim 4, wherein at least one of said lower cladding layer, lower waveguide layer, light emitting layer, upper waveguide layer, or upper cladding layer is doped n-type.

6. The semiconductor device of claim 4, wherein at least one of said lower cladding layer, lower waveguide layer, light emitting layer, upper waveguide layer, and upper cladding layer is a short-period superlattice.

7. The semiconductor device of claim 4, wherein at least one of the lower cladding layer, lower waveguide layer, upper waveguide layer, or upper cladding layer comprises a monotonically-varying alloy-compositional gradient, providing a gradient therein from lower band gap region to higher band gap region, the lower band gap region disposed nearer to the light emitting layer than the higher band gap region.

8. The semiconductor device of claim 4, further comprising an electrically conducting contact layer disposed on top of said upper cladding layer.

9. The semiconductor device of claim 8, wherein said contact layer comprises n-GaN.

10. The semiconductor device of claim 9, further comprising an ohmic metal layer disposed on top of said contact layer.

11. The semiconductor device of claim 3, wherein at least one of said lower cladding layer, lower waveguide layer, light emitting layer or upper waveguide layer is doped n-type.

12. The semiconductor device of claim 3, wherein the lower cladding layer comprises $Al_xGa_{1-x-y}In_yN$ where x is between 0.6 and 1 and y is between 0 and 0.03.

13. The semiconductor device of claim 12, wherein the lower waveguide layer comprises $Al_zGa_{1-z-y}In_yN$ where z is between 0.5 and 1 and y is between 0 and 0.03, and z<x.

14. The semiconductor device of claim 13, wherein the light emitting layer comprises $Al_uGa_{1-u-v}In_vN$ where v is between 0 and 0.03, and 0.4<u<z.

15. The semiconductor device of claim 13, wherein:
    the light emitting layer is a multiple quantum well region with at least 2 layer quantum well-barrier pairs, where the quantum wells are comprised of $Al_uGa_{1-u-v}In_vN$ and the barrier of $Al_sGa_{1-s-t}In_tN$, where 0.4<u<Z and s>(u+0.04), and t is between o and 0.03; and
    the quantum wells have a thickness between 1 and 6 nm and the barriers have a thickness between 3 and 20 nm.

16. The semiconductor device of claim 3, wherein said discharge structure comprises a metal layer disposed over and in electrical contact with at least a portion of said lower cladding or lower waveguide layer or portion of a sidewall of the device.

17. The semiconductor device of claim 1, wherein said light emitting layer comprises a structure selected from the group consisting of: a multiple quantum well structure, a double heterostructure, and a homogeneous layer.

18. The semiconductor device of claim 1, wherein said device is configured for light generation at a wavelength between 200 and 365 nm.

19. The semiconductor device of claim 1, further comprising:
an electron beam pump disposed over said light emitting layer and configured to direct an electron beam into said light emitting layer so as to create said electron hole pairs;
wherein said semiconductor device further comprises first and second optically reflective facets, a resonance cavity formed between said facets, and further wherein said electron beam is substantially linear, the electron beam pump further disposed such that said electron beam extends substantially a distance between said first and second optically reflective facets.

20. The semiconductor device of claim 19, wherein said first and second facets are concavely curved with respect to said resonance cavity, such that any rotational misalignment of said linear electron beam with a primary axis extending between said first and second facets is accommodated and optical resonance other than parallel to said primary axis is supported.

21. The semiconductor device of claim 1, further comprising:
at least two independently addressable electron beam pumps disposed over said light emitting layer, each electron beam pump configured to direct an electron beam into said light emitting layer so as to create said electron-hole pairs therein;
each said electron beam pump configured for emitting an electron beam at a different energy, to thereby provide each electron beam with a different energy deposition profile within the semiconductor device;
whereby the different energy deposition profiles are configured to result in creation of electron-hole pairs at different depths within the light emitting layer.

22. The semiconductor device of claim 1, wherein said light emitting layer comprises a first light emitting layer, and further comprising a second light emitting layer, said first and second light emitting layers formed to be at different depths within said semiconductor device, and further comprising:
at least first and second independently addressable electron beam pumps disposed over said first and said second light emitting layers, each electron beam pump configured to direct an electron beam into either said first or said second light emitting layer so as to create said electron-hole pairs therein;
each said electron beam pump configured for emitting an electron beam at a different energy, to thereby provide each electron beam with a different energy deposition profile within the semiconductor device;
whereby the different energy deposition profiles are configured to result in creation of electron-hole pairs by said first electron beam pump preferentially in said first light emitting layer, and creation of electron-hole pairs by said second electron beam pump preferentially in said second light emitting layer.

23. The semiconductor device of claim 22, wherein:
said first light emitting layer comprises a first material composition, and said second light emitting layer comprises a second material composition different than said first material composition; and
said electron-hole pairs created by said first electron beam pump preferentially in said first light emitting layer resulting in emission of light at a first wavelength; and
said electron-hole pairs created by said second electron beam pump preferentially in said second light emitting layer resulting in emission of light at a second wavelength that is different than said first wavelength.

24. A semiconductor laser device, comprising:
a substrate;
a lower cladding layer disposed over said substrate;
a lower waveguide layer disposed over said lower cladding layer;
a multiple quantum well region disposed over said lower waveguide;
an upper waveguide layer disposed over said multiple quantum well region;
a discharge structure for discharging excess charge within said semiconductor laser device; and
an electron beam pump disposed over said upper waveguide layer and configured to direct an electron beam through said upper waveguide layer and into said multiple quantum well region so as to initiate carrier recombination and thereby generate light;
said semiconductor laser device formed so as not to include a p-n junction therein, and configured for light generation without requirement for such a p-n junction.

25. The semiconductor laser device of claim 24, wherein said lower cladding layer comprises n-type $Al_{0.74}Ga_{0.26}N$.

26. The semiconductor laser device of claim 25, wherein each of said lower waveguide layer and said upper waveguide layer comprises n-type $Al_{0.7}Ga_{0.3}N$.

27. The semiconductor laser device of claim 26, wherein said multiple quantum well region comprises at least 5 layer pairs, each layer pair comprising a first layer of $Al_{0.57}Ga_{0.43}N$, substantially 5.4 nm in thickness, and a second layer of $Al_{0.62}Ga_{0.38}N$, substantially 9.6 nm in thickness.

28. The semiconductor laser device of claim 24, further comprising an upper cladding layer disposed between said upper waveguide layer and said electron beam pump.

29. The semiconductor laser device of claim 28, wherein said upper cladding layer comprises undoped AlN.

30. The semiconductor laser device of claim 28, wherein said upper cladding layer comprises n-type $Al_{0.78}Ga_{0.22}N$.

31. The semiconductor laser device of claim 30, further comprising:
an n-GaN contact layer disposed between said upper cladding layer and said electron beam pump; and
an ohmic metal layer disposed between said contact layer and said electron beam pump.

32. The semiconductor laser of claim 31, wherein said discharge structure comprises a metal layer extending over at least a portion of sidewalls of the semiconductor laser device and over at least a portion of said ohmic metal layer.

33. The semiconductor laser device of claim 24, wherein said semiconductor laser device further comprises first and second optically reflective facets, a resonance cavity formed between said facets, and further wherein said electron beam is substantially linear, the electron beam pump further disposed such that said electron beam extends substantially a distance between said first and second optically reflective facets.

34. The semiconductor laser device of claim 33, wherein said first and second facets are concavely curved with respect to said resonance cavity, such that any rotational misalignment of said linear electron beam with a primary axis extending between said first and second facets is accommodated and optical resonance other than parallel to said primary axis is supported.

35. A method of forming a semiconductor-based light emitting device, comprising:
forming, over a substrate, a lower cladding layer;
forming, over said lower cladding layer, a lower waveguide layer;
forming, over said lower waveguide layer, a multiple quantum well region;

forming, over said multiple quantum well region, an upper waveguide layer;

forming, over said upper waveguide layer, an upper cladding layer;

forming, in electrical contact with a layer of said device, a discharge structure for discharging excess voltage within said device; and disposing, over said upper cladding layer, an electron beam pump, said electron pump configured to direct an electron beam through said upper cladding layer and said upper waveguide layer and into said multiple quantum well region so as to initiate carrier recombination and thereby generate light;

said device formed so as not to include a p-n junction therein, and configured for light generation without requirement for such a p-n junction.

36. The method of claim 35, further comprising:

forming said lower cladding layer to comprise n-type $Al_{0.74}Ga_{0.26}N$;

forming each of each of said lower waveguide layer and said upper waveguide layer to comprise n-type $Al_{0.7}Ga_{0.3}N$; and forming said multiple quantum well region to comprise at least 5 layer pairs, each layer pair comprising a first layer of $Al_{0.57}Ga_{0.43}N$, substantially 5.4 nm in thickness, and a second layer of $Al_{0.62}Ga_{0.38}N$, substantially 9.6 nm in thickness.

37. The method of claim 36, further comprising:

forming said upper cladding layer to comprise n-type $Al_{0.78}Ga_{0.22}N$;

forming a contact layer between said upper cladding layer and said electron beam pump, said contact layer comprising n-GaN; and forming an ohmic metal layer between said contact layer and said electron beam pump, said ohmic metal layer comprising titanium.

38. The method of claim 37, further comprising forming said discharge structure as a layered structure extending over at least a portion of sidewalls of the device and over at least a portion of said ohmic metal layer, said layered structure comprising Ti substantially 20 nm in thickness, Al substantially 100 nm in thickness formed over said Ti, Ni substantially 45 nm in thickness formed over said Al, and Au substantially 60 nm in thickness formed over said Ni, and annealing said layered structure.

39. The method of claim 35, further comprising:

forming said device to comprise first and second optically reflective facets;

forming a resonance cavity between said facets; and wherein said electron beam is substantially linear, disposing said electron beam pump such that said electron beam extends substantially a distance between said first and second optically reflective facets.

40. The method of claim 39, further comprising forming said first and second facets to be concavely curved with respect to said resonance cavity, such that any rotational misalignment of said linear electron beam with a primary axis extending between said first and second facets is accommodated and optical resonance other than parallel to said primary axis is supported.

41. A method of forming a semiconductor light emitting device, comprising:

forming, over a substrate, a light guiding structure;

forming a light emitting layer at a specified depth within the light guiding layer, the specified depth determined by a method comprising:

determining, for an electron beam source, a peak of an electron-energy deposition profile within said light guiding structure and said light emitting layer;

determining a distance from a surface of said device at which said peak occurs within said light guiding structure;

determining said specified depth from said distance such that there is substantial overlap between a location of the peak of the electron-energy deposition profile and a location of the light emitting layer within the light guiding structure;

forming a discharge structure in electrical communication with said light guiding structure for discharging excess electric charge within said device;

configuring said device such that electron-hole pairs may be created by an electron beam issued by said electron beam source, in the absence of a p-n junction, and wherein recombination by the electron-hole pairs predominantly occurs in the light emitting layer to thereby generate light; and configuring said device such that said light emitting layer is not embedded within a p-n junction.

42. The method of claim 41, further comprising securing said electron beam source over said device.

* * * * *